United States Patent [19]

Korn

[11] Patent Number: 4,593,252

[45] Date of Patent: Jun. 3, 1986

[54] ENHANCED TRANSCONDUCTANCE AMPLIFIER

[75] Inventor: Thomas H. Korn, Tucson, Ariz.

[73] Assignee: Burr-Brown Corporation, Tucson, Ariz.

[21] Appl. No.: 608,648

[22] Filed: May 3, 1984

[51] Int. Cl.$^4$ .............................................. H03F 1/34
[52] U.S. Cl. .................................. 330/260; 330/294; 330/295
[58] Field of Search .................... 330/84, 99, 100, 102, 330/103, 105, 260, 293, 294, 295

[56] References Cited

U.S. PATENT DOCUMENTS 4,349,788  9/1982  Sondermeyer .................. 330/100 X

OTHER PUBLICATIONS

Wurcer et al, "A Programmable Instrumentation Amplifier for 12-Bit Resolution Systems," IEEE Journal of Solid-State Circuits, vol. SC-17, No. 6, Dec. 1982, pp. 1102-1111.

*Primary Examiner*—James B. Mullins
*Attorney, Agent, or Firm*—Cahill, Sutton & Thomas

[57] ABSTRACT

An amplifier having a very high gain-bandwidth product includes a first operational amplifier having its positive input connected to the amplifier's input. The output of the first operational amplifier is connected to the base of a transistor, the emitter of which is coupled by a gain-setting resistor to ground and is also directly connected to the negative input of the first operational amplifier. The collector of the transistor is connected by a resistive load to a supply voltage and is also directly connected to the negative input of a second operational amplifier. The output of the second operational amplifier is coupled by a capacitor back to its negative input. The output of the second operational amplifier is coupled by a feedback resistor back to the emitter of the transistor. The output of the second operational amplifier is connected to the output terminal of the amplifier. The effective dynamic emitter resistance of the transistor is reduced by the gain of the first operational amplifier causing the transconductance of the amplifier to be proportional to the open or closed loop gain thereof for all practical values of closed loop gain. In a described embodiment of the invention, two such amplifiers stages are coupled to form an instrumentation amplifier.

10 Claims, 4 Drawing Figures

ENHANCED TRANSCONDUCTANCE AMPLIFIER

BACKGROUND OF THE INVENTION

The invention relates to amplifiers, especially monolithic integrated circuit amplifiers, and more particularly to such amplifiers having very high gain-bandwidth products, and more particularly to instrumentation amplifiers having very high gain bandwidth products.

A "classical" single pole operational amplifier has a gain given by the equation:

$$A_v = \frac{V_{out}}{V_{in}} = \frac{g_m}{C_s}. \tag{1}$$

In this equation, $V_{in}$ is the "small signal" or AC input voltage, and $V_{out}$ is the AC output voltage. $C_s$ is the capacitance of the compensation capacitor, and $g_m$ is the transconductance of the amplifier. Those skilled in the art know that the gain-bandwidth product for this type of circuit is essentially constant. This means that as the closed loop gain of the amplifier is increased, its bandwidth decreases proportionately, making it very difficult to obtain high gain at high frequencies.

Instrumentation amplifiers are commonly used to amplify small differential input signals to produce differential or single ended output signals. Such instrumentation amplifiers commonly utilize two single ended amplifiers coupled together by a common gain-setting resistor plus a differential-to-single ended converter or a difference amplifier.

A significant recent advance in improving the gain-bandwidth product of amplifiers and instrumentation amplifiers is thoroughly described in "A Programmable Instrumentation Amplifier for 12-Bit Resolution Systems", by Wurcer and Counts, pages 1102–1111 of the *IEEE Journal of Solid State Circuits*, Vol. SC-17 No. 6, December 1982, incorporated herein by reference. FIG. 1 in that article shows a simplified instrumentation amplifier, and FIG. 2 shows a complete schematic of an instrumentation amplifier. The AC performance of the individual amplifiers which form the input stages of the instrumentation amplifier is described in detail on pages 1109 and 1110. An improved feedback amplifier circuit having a greatly improved gain-bandwidth product only at low values of closed loop gain is disclosed and described. In the described circuit, the input signal is applied to the base of an NPN transistor, the emitter of which is connected to a summing node. A gain-setting resistor $R_G$ is connected between the summing node and ground. The collector of the NPN transistor is coupled to a resistive load (such as a PNP current source), and also to the negative input of an operational amplifier having gain A. The output of the operational amplifier is coupld back to the negative input of the operational amplifier by a capacitor C and is connected by a resistor $R_F$ back to the summing node. The effective $g_m$ for this circuit is given by the equation $$g_m(\text{eff}) = \frac{1}{r_e + R_G \| R_F}. \tag{2}$$

It can be shown that this expression can be re-written as $$g_m(\text{eff}) = \frac{1}{r_e + \frac{R_F}{A_{CL}}}, \tag{3}$$

where $A_{CL}$ is the closed loop gain of the amplifier. $r_e$ is the dynamic emitter resistance of the NPN input transistor, and typically has a value of 500 ohms. The feedback resistance $R_F$ typically has a value of about 20 kilohms. Consequently, it can be seen that for low values of closed loop gain $A_{CL}$, below approximately 40, $r_e$ is negligible, and therefore the effective gain of the improved feedback amplifier is given by the equation $$g_m \text{ (low gain)} \simeq \frac{A_{CL}}{R_F}. \tag{4}$$

However, for high values of $A_{CL}$, the $r_e$ term dominates, and then the effective transconductance is given by the expression $$g_m \text{ (high gain)} \simeq \frac{1}{r_e}. \tag{5}$$

Thus, it can be seen that for low closed loop gains, the transconductance of the amplifier is not constant, as in the "classical" case, but instead is proportional to the closed loop gain of the amplifier. As the gain is increased, the bandwidth is also increased, and the gain-bandwidth product is also increased. The unity gain frequency is also increased. Those skilled in the art will recognize that what this really means is that the bandwidth stays constant as the closed loop gain is increased, as long as the $r_e$ term is negligible. However, when the closed loop current gain $A_{CL}$ increases beyond approximately 40, so that the $r_e$ term is no longer negligible, from that point on, the circuit behaves like the "classical" circuit in that the gain-bandwidth product is constant. Further increases in the gain $A_{CL}$ are made at the expense of bandwidth, and at very high frequencies very little amplifier gain is available compared to amounts available at low frequencies.

Nevertheless, the circuit described in the above-mentioned Wurcer-Counts paper has been commercially very successful, and in many of its applications there has been no need to sacrifice gain for bandwidth. When increased gain has been needed, it has been possible to extend the range of $A_{CL}$ in which equation (4) above holds by increasing the emitter current of the NPN transistor, thereby reducing $r_e$. However, there is a definite limit to which this is practical, because increasing the emitter currents increases the power dissipation and increases the base currents of the input transistors, reducing the input impedance of the amplifier, and, especially when transducers having high output impedance are connected to the base of the input transistors, results in amplification of noise components of the base currents. Furthermore, mismatches in the increased base currents would result in increased offset voltages between the amplifier inputs.

Thus, there remain numerous applications in which it would be desirable to have a feedback amplifier that avoids the above-described "classical" gain-bandwidth trade-off problem, not only for low closed loop gains, but also for high closed loop gains.

SUMMARY OF THE INVENTION

Accordingly, it is an object of the invention to provide an amplifier having a very high gain-bandwidth product.

It is another object of the invention to provide an instrumentation amplifier having an extremely high gain-bandwidth product, even at very high gains.

It is another object of the invention to provide a feedback amplifier with a very high gain-bandwidth product without adding undue additional complexity and cost to the closest prior art amplifiers.

It is another object of the invention to provide an amplifier having a very high input impedance and a very high gain-bandwidth product at both low and also very high values of the amplifier's closed loop gain.

It is another object of the invention to provide an instrumentation amplifier having a very high bandwidth and having sufficiently high input impedance to avoid the effects of signal deterioration and/or noise currents when connected to the outputs of very high output impedance transducers.

It is another object of the invention to provide an amplifier circuit that is conducive to increased flexibility in the design of amplifying and transconductance portions thereof and that has a bandwidth which is substantially independent of closed loop gain.

Briefly described, and in accordance with one embodiment thereof, the invention provides an improved amplifier circuit including a first amplifying stage having therein an operational amplifier with capacitive feedback to an input, a transconductance circuit having an output terminal coupled to an input of the first amplifying stage and also having an output coupled by a feedback resistor to an output of the first amplifying stage, a gain-setting resistor coupled to the second output terminal of the transconductance stage, and a second amplifying stage having a first input for receiving the voltage signal to be amplified, negative feedback from an output of said second amplifying stage to an input thereof, the output of the second amplifying stage being coupled to a control input of the transconductance stage. The improved amplifier circuit produces high bandwidth performance at low and high values of closed loop gain. In a described embodiment of the invention, the first and second amplifying stages include operational amplifiers. The transconductance circuit includes an NPN transistor having its base connected to the output of the operational amplifier contained in the input amplifying stage and having its emitter connected to the negative input of that operational amplifier. The positive input of the first operational amplifier is coupled to an input signal $V_{in}$. The collector of the NPN transistor is connected to a load resistance and to the negative input of a second operational amplifier included in the second amplifying stage. The output of the second operational amplifier is connected to the output of the amplifier circuit and is capacitively coupled back to the negative input of the second operational amplifier. The output of the second operational amplifier circuit is also coupled by means of a feedback resistor back to the emitter of the NPN transistor. The emitter of the NPN transistor is coupled to a ground conductor by a gain-setting resistor. In one embodiment of the invention, two such amplifier circuits are coupled together to produce an instrumentation amplifier. The function of the first operational amplifier is to effectively divide the emitter resistance of the NPN transistor by the gain of the first operational amplifier, thereby making the "effective" emitter resistance of the NPN transistor negligible, even at very high closed loop gain values. This causes the effective transconductance of the amplifier circuit to be proportional to the closed loop gain at high values of closed loop gain as well as low values, as determined by the amount of feedback.

DESCRIPTION OF THE INVENTION

Figure 1:
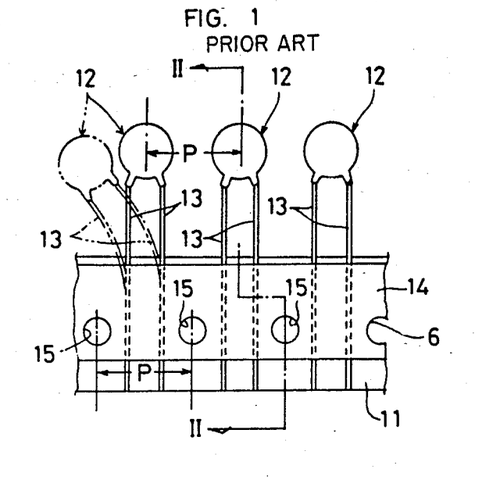
FIG. 1 is a schematic circuit diagram of an enhanced transconductance amplifier of the present invention.

Referring now to FIG. 1, amplifier 1 includes an operational amplifier 2, having a gain of A1 and an operational amplifier 3, which has a gain of A2. The positive input of operational amplifier 2 is connected to conductor 4, to which an input voltage $V_{in}$ is applied. The negative input of operational amplifier 2 is connected to conductor 5. The output of operational amplifier 2 is connected to the base of NPN transistor 6. The emitter of transistor 6 is connected to summing conductor 5. Conductor 5 is connected by a gain-setting resistor 7 to ground conductor 8. The collector of transistor 6 is coupled by a resistive load, which is illustrated as a current source 9. The collector of transistor 6 is also coupled by means of conductor 10 to a negative input of operational amplifier 3. The negative input of operational amplifier 3 is also connected by feedback capacitor 11 to the output of operational amplifier 3, which output is also connected to output terminal 12. Output voltage $V_{out}$ is produced on output terminal 12 by amplifier 3. Conductor 12 is also connected by means of feedback resistor 13 to conductor 5. A constant current source 24 is connected between summing conductor 5 and ground conductor 8. The value of current supplied by constant current source 24 is equal to the operating value of the current flowing in resistive load or current source 9, in order to properly DC bias transistor 6 for normal operation. The positive input of operational amplifier 3 is connected to a bias source designated by a battery or voltage source 14.

For the purpose of describing the operation of the amplifier 1, the value of gain-setting resistor 7 will be assumed to have a value of $R_G$, feedback resistor 13 will have a value designated by $R_F$, and the resistance of the load device 9 will have a value $R_L$. For a closed loop gain of 1000, a typical value of $R_G$ might be 20 ohms, a typical value $R_F$ might be 20 kilohms, and a typical value $R_L$ might be 1 megohm. Typical values of A1 and A2 might be $10^{+4}$ to $10^6$.

The effective $g_m$ of the above-described amplifier circuit is given by the equation $$g_m(\text{eff}) = \frac{1}{\frac{r_e}{A1} + \frac{R_F}{A_{CL}}}. \qquad (6)$$

This expression can be readily derived by those skilled in the art, and therefore the rigorous derivation of the equation is omitted for convenience. However, it can be intuitively seen that the above expression is identical to Equation (3) given above for the closest prior art amplifier, except that the dynamic emitter resistance $r_e$ of transistor 6 now is divided by the gain A1 of operational amplifier 2. The function of operational amplifier 2 is to increase the effective $g_m$ of NPN transistor 6 by a factor equal to A1.

Since A1 can have values that easily exceed one million, it can be seen that the term $r_e/A1$ in Equation (6) above is negligible for very large values of closed loop gain $A_{CL}$, and hence the effective transconductance in the gain equation for amplifier 1 is given by the expression $$g_m(\text{eff}) = \frac{A_{CL}}{R_F}. \tag{7}$$

This is the same as Equation (4) above, which applies for low closed loop gains in the input circuit described in the above referenced Wurcer-Counts paper. However, in the circuit of the present invention, this equation is applicable at all practical values of closed loop gain $A_{CL}$, not just low values. Therefore, the circuit of the present invention is not subject to the above-mentioned drawbacks of the closest prior art amplifier. For essentially all practical values of A1 and A2, amplifier 1 has a gain-bandwidth product that is proportional to the closed loop gain $A_{CL}$. Approximately the same bandwidth is achieved at very high values of closed loop gain as at very low values, so the circuit designer does not have to make undesirable compromises between gain and bandwidth in the amplifier of the present invention. This represents a significant step forward in the design of high frequency amplifiers, especially in their applications in instrumentation amplifiers.

Figure 3:
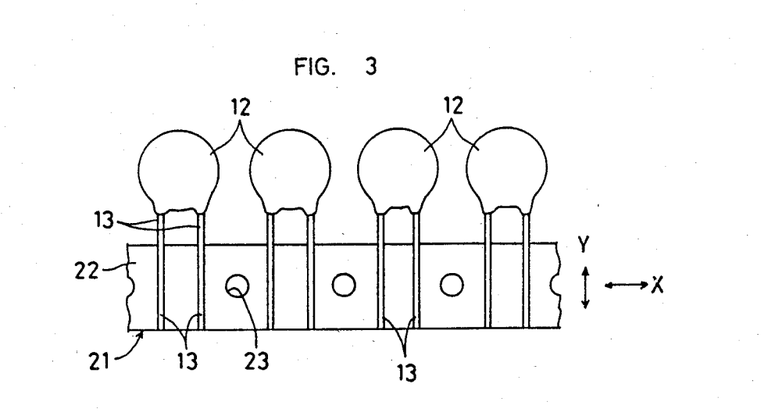
FIG. 3 is a Bode plot useful in explaining the operation of the enhanced transconductance amplifier of FIG. 1.

FIG. 3 shows a typical Bode plot which may be helpful in illustrating the operation of the amplifier of FIG. 1. In FIG. 3, reference numeral 16 designates the frequency response of a "classical" operational amplifier, wherein the logarithm of the amplifier gain is plotted against the vertical scale versus the logarithm of the frequency on the horizontal scale. It can readily be seen that increases in the amplifier gain result in decreases in the bandwidth. Reference numeral 17 designates the corresponding frequency response of the amplifier of FIG. 1. Curve 17 shows much higher values of amplifier gain at each frequency than curve 16. This improvement is achieved as a result of the combination of NPN transistor 6 with operational amplifier 2, as indicated in FIG. 1, in the "classical" amplifier structure (in which the input signal is applied to the negative input of the amplifier). In FIG. 3, vertical line 18 designates a particular frequency at which it is desired to operate the amplifier 1. As the gain of the amplifier is increased by adjusting the value of $R_G$, the amplifier gain moves upward along line 18 to the limit represented by line 17 but the bandwidth of amplifier 1 does not decrease.

Figure 4:
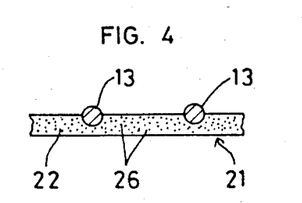
FIG. 4 is a logarithmic plot useful in explaining the comparison of the enhanced transconductance amplifier of FIG. 1 to the closest prior art amplifiers.
Figure 5:
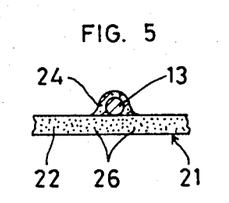
Figure 6:
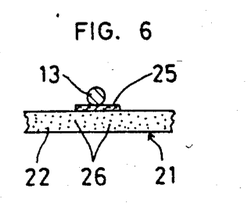
Figure 7:
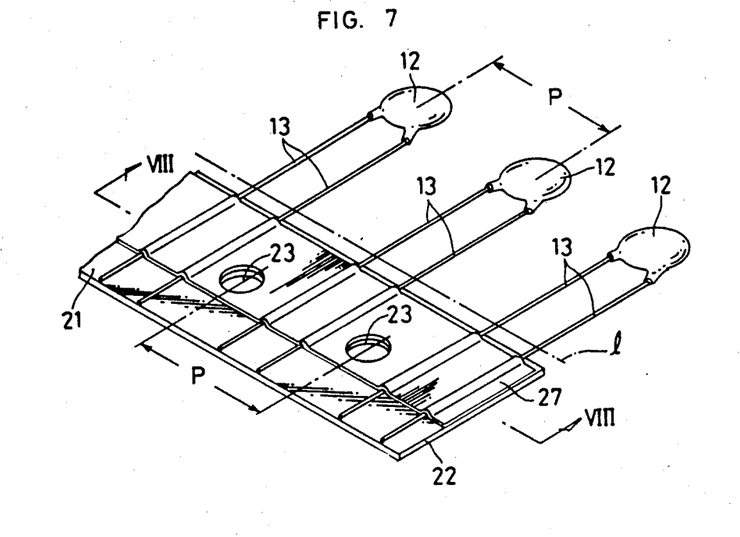
Figure 8:
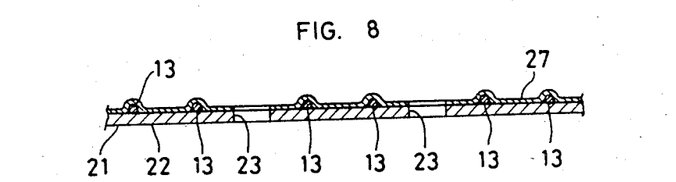
Figure 9:
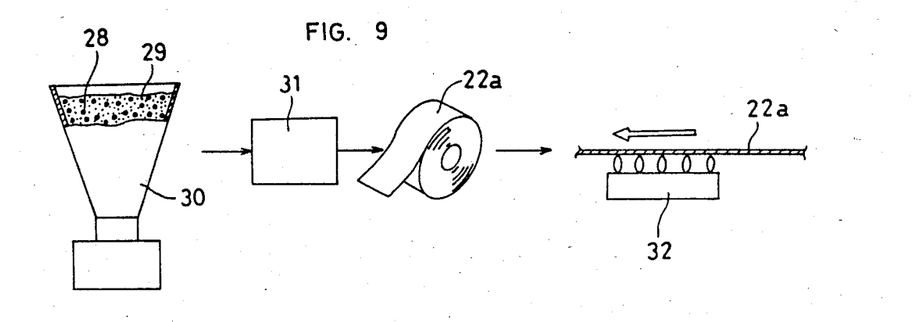

The improvement of the gain-bandwidth product of the enhanced transconductance amplifier 1 of FIG. 1 over the closest known prior art circuit, which is embodied in the Analog Devices 524 instrumentation amplifier, is illustrated in FIG. 4. In FIG. 4, reference numeral 25 designates the plot of gain-bandwidth product versus closed loop gain of the circuit of the present invention. Curves 26, 27, and 28 are corresponding plots for collector (and emitter) currents (of the NPN input transistor) of 25, 50 and 100 microamperes for the Analog Devices 524 type of instrumentation amplifier. These curves clearly show that the gain-bandwidth product of the enhanced transconductance amplifier of the present invention is not constant, even at very high values of closed loop gain, whereas, for the prior art amplifier, at gains above even 40, and even at substantially increased emitter currents in the NPN input trnsistors, a substantial sacrifice in gain needs to be made to achieve a large bandwidth.

Figure 2:
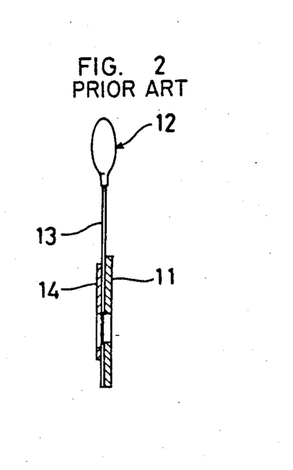
FIG. 2 is a circuit diagram of an instrumentation amplifier utilizing two enhanced transconductance amplifiers similar to the ones shown in FIG. 1.

Referring now to FIG. 2, a simplified circuit schematic is shown of an instrumentation amplifier 20 which utilizes the concept embodied in amplifier 1 of FIG. 1. Instrumentation amplifier 20 includes two amplifier stages including the one enclosed by dotted line 21, which are essentially identical to amplifier 1. Similar reference numerals are used in FIG. 2 to designate components which correspond to those shown in FIG. 1. Thus, the instrumentation amplifier 20 shown in FIG. 2 includes two improved feedback amplifiers such as 1 in FIG. 1, having their summing nodes 5-1 and 5-2 coupled together by a gain-setting resistor 7A, and sharing a common bias source 14A coupled to the positive inputs of their second stage amplifiers 3. A current source 24-1 having the same constant current as current source 9 is connected between ground conductor 8 and summing node 5-1. Similarly, current source 24-2 is connected between conductor 5-2 and ground conductor 8. Those skilled in the art can show that the transfer characteristic of this instrumentation amplifier is given by the equation $$\frac{V_{out}}{\Delta V_{in}} = 1 + \frac{2R_F}{R_G}, \tag{8}$$

wherein $\Delta V_{in} = V_{in1} - V_{in2}$.

This instrumentation amplifier 20 will have a gain-bandwidth product similar to that for each of the two feedback amplifiers which it contains. The instrumentation amplifier bandwidth will be essentially independent of its closed loop gain for a very large, as well as small values of closed loop gain.

While the invention has been described with reference to several particular embodiments thereof, those skilled in the art will be able to make various changes to the described embodiments without departing from the true spirit and scope of the invention. For example, a field effect transistor, either a MOSFET or a JFET, might be advantageous instead of the disclosed NPN transistor, especially to obtain certain level shifts that might be desired. Other amplifying circuits than the disclosed operational amplifiers might be advantageously used to implement amplifiers 2 and 3.

For example, amplifier 2 in FIG. 1 can be implemented by means of a much simpler amplifier than a typical operational amplifier. Similarly, an amplifier circuit less complex than a typical operational amplifier can be used to implement amplifier 3. Other types of feedback, such as current feedback, can be used than the $R_F$ resistors shown. Alternate ways of compensating the inventive circuit other than the precise connection of compensating capacitor 11 shown in FIG. 1 might also be provided.

I claim:

1. An amplifier circuit having an input conductor for receiving an input voltage signal and an output conductor on which an output voltage signal is produced, said amplifier circuit comprising in combination:

a first amplifier having a first input coupled to said input conductor, a second input, and an output;

a transistor having first, second and third terminals, said first terminal of said transistor controlling current in said second and third terminals of said transistor, said first and second terminals of said transistor being coupled to said output and said second input, respectively, of said first amplifier;

a second amplifier having a first input, a second input coupled to said third terminal of said transistor, and an output;

a load element coupled to said third terminal of said transistor;

a compensation capacitor coupled between said output of said second amplifier and said second input of said second amplifier;

a feedback resistor coupled between said output of said second amplifier and said second terminal of said transistor; and a gain-setting resistor coupled to said second terminal of said transistor; and means for biasing said first input of said second amplifier to a predetermined level.

2. The amplifier circuit of claim 1 wherein said first and second amplifier circuits each include an operational amplifier circuit.

3. The amplifier circuit of claim 2 wherein said transistor is a bipolar transistor, said first, second, and third terminals of said transistor being the base, emitter and collector terminals, respectively, of said bipolar transistor.

4. The amplifier circuit of claim 3 wherein said transistor is an NPN transistor, said first and second amplifiers are operational amplifiers, and the first input of each of said first and second amplifiers is a positive input thereof and the second input of each of said first and second amplifiers is a negative input thereof.

5. The amplifier circuit of claim 4 wherein said load element has a resistance in the range of roughly 1000 ohms to 1 megohm, said feedback resistor has a resistance in the range of roughly 1000 ohms to 100 kilohms, and said gain-setting resistor has a resistance of at least roughly 10 ohms.

6. The amplifier circuit of claim 1 wherein the gain of said first amplifier has a value sufficiently large to cause the value of the ratio of the closed loop gain of said amplifier circuit to said feedback resistance to be substantially less than the transconductance of said transistor multiplied by the gain of said first amplifier.

7. The amplifier circuit of claim 4 further including means coupled to the emitter of said transistor for causing a bias current to flow through said transistor, said bias current being approximately equal to the current flowing in said load elements.

8. An amplifier circuit having an improved gain-bandwidth product, said amplifier circuit comprising in combination:
(a) a first amplifying stage including an operational amplifier with capacitive feedback to an input thereof;
(b) a transconductive circuit having a first terminal coupled to a load device and to said input of said first amplifying stage, and a second terminal coupled by means of a feedback resistor to an output of said first amplifying stage;
(c) a gain-setting resistor coupled to said feedback resistor, and forming a junction therewith for setting the gain of said amplifier circuit; and
(d) a second amplifying stage having a first input coupled to an input of said amplifier circuit, an output coupled to an input of said transconductance circuit, and a second input coupled to the junction of said gain-setting resistor and said feedback resistor, whereby the effective transconductance of said transconductance circuit is enhanced enough to make the effective transconductance of said amplifier circuit approximately proportional to the closed loop gain of said amplifier circuit both at low and at very high closed loop gains.

9. A method of operating an amplifier to increase the bandwidth thereof at high values of closed loop gain thereof, said method comprising the steps of:

applying an AC input signal to an input of a first amplifier to cause said first amplifier to produce a first signal;

applying said first signal to a control input of a transconductance circuit to cause a corresponding variation in a current through said transconductance circuit, to thereby effectively multiply the transconductance of said transconductance circuit by the gain of said first amplifier;

producing a negative feedback signal in said transconductance circuit in response to said first signal and applying said negative feedback signal to an input of said first amplifier; and applying an output signal produced by said transconductance circuit in response to said first signal to an input of a second amplifier, the output of which second amplifier is resistively fed back to said transconductance circuit, the increased effective transconductance of said transconductance device which occurs as a result of amplification by said first amplifier causing the transconductance of said amplifier to be substantially proportional to the closed loop gain of said amplifier at all values of closed loop gain up to a value at which the ratio of the said closed loop gain of said amplifier to said feedback resistance is substantially less than the transconductance of said transconductance device multiplied by said gain of said first amplifier.

10. An instrumentation amplifier including first and second amplifier circuits, each having a summing node conductor, and a gain-setting resistor coupling said summing node conductors of said first and second amplifier circuits together, each of said first and second amplifier circuits including
(a) an input conductor for receiving an input voltage signal and an output conductor on which an output signal is produced;
(b) a first amplifier having a first input coupled to said input conductor, a second input, and an output;
(c) a transistor having first, second and third terminals, said first terminal of said transistor controlling current in said second and third terminals of said transistor, said first and second terminals of said transistor being coupled to said output and said second input, respectively, of said first amplifier, said second terminal of said transistor also being coupled to the summing node conductor of the amplifier circuit;
(d) a second amplifier having a first input, a second input coupled to said third terminal of said transistor, and an output;

(e) a load element coupled to said third terminal of said transistor;

(f) a compensation capacitor coupled between said output of said second amplifier and said second input of said second amplifier;

(g) a feedback resistor coupled between said output of said second amplifier and said summing node conductor; and (h) current source means coupled to the summing node conductor of that amplifier circuit for causing a bias current to flow through said transistor, an output of said instrumentation amplifier being the voltage difference between said outputs of said first and second amplifier circuits.

* * * * *

UNITED STATES PATENT AND TRADEMARK OFFICE
CERTIFICATE OF CORRECTION

PATENT NO. : 4,593,252

DATED : June 3, 1986

INVENTOR(S) : Thomas H. Korn

It is certified that error appears in the above-identified patent and that said Letters Patent is hereby corrected as shown below:

The title page should be deleted to appear as per attached title page.

The sheets of drawings should be deleted to appear as per attached sheets.

Signed and Sealed this

Twenty-first Day of October, 1986

[SEAL]

Attest:

Attesting Officer

DONALD J. QUIGG

Commissioner of Patents and Trademarks

United States Patent [19]

Korn

[11] Patent Number: 4,593,252

[45] Date of Patent: Jun. 3, 1986

[54] ENHANCED TRANSCONDUCTANCE AMPLIFIER

[75] Inventor: Thomas H. Korn, Tucson, Ariz.

[73] Assignee: Burr-Brown Corporation, Tucson, Ariz.

[21] Appl. No.: 606,648

[22] Filed: May 3, 1984

[51] Int. Cl.$^4$ .............................................. H03F 1/34
[52] U.S. Cl. .................................. 330/260; 330/294; 330/295
[58] Field of Search .................. 330/84, 99, 100, 102, 330/103, 105, 260, 293, 294, 295

[56] References Cited

U.S. PATENT DOCUMENTS 4,349,788  9/1982  Sondermeyer ................ 330/100 X

OTHER PUBLICATIONS

Wurcer et al, "A Programmable Instrumentation Amplifier for 12-Bit Resolution Systems," IEEE Journal of Solid-State Circuits, vol. SC-17, No. 6, Dec. 1982, pp. 1102-1111.

Primary Examiner—James B. Mullins
Attorney, Agent, or Firm—Cahill, Sutton & Thomas

[57] ABSTRACT

An amplifier having a very high gain-bandwidth product includes a first operational amplifier having its positive input connected to the amplifier's input. The output of the first operational amplifier is connected to the base of a transistor, the emitter of which is coupled by a gain-setting resistor to ground and is also directly connected to the negative input of the first operational amplifier. The collector of the transistor is connected by a resistive load to a supply voltage and is also directly connected to the negative input of a second operational amplifier. The output of the second operational amplifier is coupled by a capacitor back to its negative input. The output of the second operational amplifier is coupled by a feedback resistor back to the emitter of the transistor. The output of the second operational amplifier is connected to the output terminal of the amplifier. The effective dynamic emitter resistance of the transistor is reduced by the gain of the first operational amplifier causing the transconductance of the amplifier to be proportional to the open or closed loop gain thereof for all practical values of closed loop gain. In a described embodiment of the invention, two such amplifiers stages are coupled to form an instrumentation amplifier.

10 Claims, 4 Drawing Figures